US011784460B2

(12) United States Patent
Chen et al.

(10) Patent No.: US 11,784,460 B2
(45) Date of Patent: Oct. 10, 2023

(54) BUMP BONDING STRUCTURE TO MITIGATE SPACE CONTAMINATION FOR III-V DIES AND CMOS DIES

(71) Applicant: Taiwan Semiconductor Manufacturing Co., Ltd., Hsin-Chu (TW)

(72) Inventors: Jhih-Bin Chen, Hsinchu (TW); Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 148 days.

(21) Appl. No.: 17/321,858

(22) Filed: May 17, 2021

(65) Prior Publication Data

US 2021/0273402 A1 Sep. 2, 2021

Related U.S. Application Data

(63) Continuation of application No. 16/417,712, filed on May 21, 2019, now Pat. No. 11,025,033.

(51) Int. Cl.
| | |
|---|---|
| *H01S 5/02375* | (2021.01) |
| *H01S 5/183* | (2006.01) |
| *H01S 5/42* | (2006.01) |
| *H01S 5/0237* | (2021.01) |
| *H01S 5/02325* | (2021.01) |
| H01S 5/30 | (2006.01) |

(52) U.S. Cl.
CPC ........ *H01S 5/02375* (2021.01); *H01S 5/0237* (2021.01); *H01S 5/02325* (2021.01); *H01S 5/183* (2013.01); *H01S 5/423* (2013.01); *H01S 5/3013* (2013.01)

(58) Field of Classification Search
CPC .............. H01S 5/02325; H01S 5/0237; H01S 5/02375; H01S 5/183; H01S 5/18305; H01S 5/423
See application file for complete search history.

(56) References Cited

U.S. PATENT DOCUMENTS

| | | |
|---|---|---|
| 4,873,696 A | 10/1989 | Coldren et al. |
| 5,115,441 A | 5/1992 | Kopf et al. |
| 5,136,603 A | 8/1992 | Hasnain et al. |
| 5,912,913 A | 6/1999 | Kondow et al. |
| 6,036,872 A | 3/2000 | Wood et al. |

(Continued)

OTHER PUBLICATIONS

Non-Final Office Action dated Mar. 13, 2020 for U.S. Appl. No. 16/417,712.

(Continued)

*Primary Examiner* — Michael Carter
(74) *Attorney, Agent, or Firm* — Eschweiler & Potashnik, LLC

(57) ABSTRACT

Various embodiments of the present disclosure are directed towards a method for forming a vertical cavity surface emitting laser (VCSEL) device. The method includes forming a bond bump and a bond ring over a substrate. A semiconductor die is bonded to the bond ring. A molding layer is formed around the semiconductor die. The molding layer is laterally offset from a cavity between the semiconductor die and the substrate. A VCSEL structure is formed over the bond bump.

20 Claims, 13 Drawing Sheets

(56) References Cited

U.S. PATENT DOCUMENTS

| | | |
|---|---|---|
| 2001/0008311 A1* | 7/2001 | Harada .................. H01L 24/05 |
| | | 257/758 |
| 2003/0179800 A1 | 9/2003 | Uebbing |
| 2004/0066816 A1 | 4/2004 | Collins, III et al. |
| 2005/0231070 A1* | 10/2005 | Fazzio .................. H01H 11/02 |
| | | 310/328 |
| 2006/0281363 A1 | 12/2006 | Trezza |
| 2007/0009212 A1 | 1/2007 | Martini et al. |
| 2008/0247436 A1 | 10/2008 | Carter et al. |
| 2012/0051384 A1 | 3/2012 | Geske et al. |
| 2015/0098171 A1 | 4/2015 | Nagatomo et al. |
| 2019/0109108 A1* | 4/2019 | Koduri .................. H01L 24/14 |
| 2019/0167084 A1* | 6/2019 | Nakagawa ......... G02B 23/2484 |
| 2019/0245326 A1 | 8/2019 | Halbritter et al. |

OTHER PUBLICATIONS

Final Office Action dated Jul. 21, 2020 for U.S. Appl. No. 16/417,712.
Non-Final Office Action dated Oct. 22, 2020 for U.S. Appl. No. 16/417,712.
Notice of Allowance dated Feb. 1, 2021 for U.S. Appl. No. 16/417,712.

* cited by examiner

US 11,784,460 B2

BUMP BONDING STRUCTURE TO MITIGATE SPACE CONTAMINATION FOR III-V DIES AND CMOS DIES

REFERENCE TO RELATED APPLICATION

This Application is a Continuation of U.S. application Ser. No. 16/417,712, filed on May 21, 2019, the contents of which are hereby incorporated by reference in their entirety.

BACKGROUND

Semiconductor chips are used in all kinds of electronic and other devices and are well-known. Today's wide-spread use of such chips, and consumer demands for more powerful and more compact devices dictates that chip manufacturers continuously decrease the physical size and continuously increase the functionality of such chips. To shrink the chip footprint, manufacturers increasingly push to obtain smaller feature sizes and die sizes, resulting in a larger number of dies within a fixed wafer size. Next generation fabrication methods are envisioned to integrate type III-V devices to complementary metal-oxide-semiconductor (CMOS) chips or to wafers, and to do so in a high reliability, high speed and footprint efficient manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
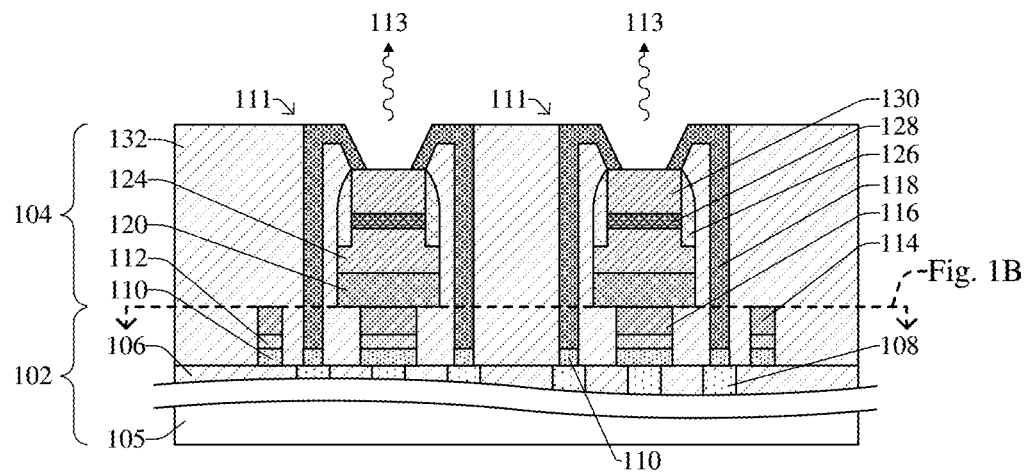
FIG. 1A illustrates a cross-sectional of some embodiments of a three-dimensional integrated chip (3DIC) comprising a complementary metal-oxide-semiconductor (CMOS) IC and an III-V device structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Currently known processes to integrate a type III-V die comprising a vertical cavity surface emitting laser (VCSEL) device with a complementary metal-oxide-semiconductor (CMOS) die may involve individually placing a number of type III-V dies upon a CMOS wafer and effecting a bond where they contact. Such a process is typically referred to as a "pick and place" process. The CMOS wafer includes a bonding seed layer overlying a substrate and a plurality of bonding bumps overlying the bonding seed layer. The type III-V dies respectively comprise a sacrificial substrate overlying a type III-V structure. During the "pick and place" process, the type III-V dies are placed over the bonding bumps and subsequently bonded to the CMOS wafer. After the bonding process, a molding layer is disposed around each type III-V die such that the molding layer is disposed above the bonding seed layer between each bonding bump. A first removal process is performed to remove the sacrificial substrate and expose the type III-V structure such that the molding layer remains between the bonding seed layer and each type III-V structure. The type III-V structures are patterned to form a plurality of VCSEL devices. A second removal process is performed to remove the molding layer and subsequently form conductive vias extending from the CMOS wafer to a top of each VCSEL device. The substrate is subsequently singulated.

A challenge with the "pick and place" process is in the molding layer disposed around each bonding bump. The molding layer may mitigate an ability to form the conductive vias. After the first removal process, the molding layer undergoes a plurality of processing steps (e.g., dry etch process(es), planarization process(es), and/or formation process(es), etc.). During these processing steps the molding layer is chemically hardened such that a wet etch process may be unable to remove the molding layer. Thus, a high power dry etching process is utilized to remove the molding layer. However, during the high power dry etching process conductive materials may re-deposit in undesired locations, thereby rendering the VCSEL devices inoperable.

In some embodiments, the present disclosure relates to a method that prevents a hardened molding layer from mitigating an ability to form conductive vias during fabrication of a 3DIC. For example, to mitigate an effect of the hardened molding layer, a bond ring may be formed around the bonding bumps. Bond rings are formed over the CMOS wafer for each type III-V die. The bond rings are configured to block formation of the molding layer between each type III-V die and the bonding seed layer. Therefore, after a first removal process the molding layer does not exist between the bonding seed layer and each type III-V structure. By blocking formation of the molding layer between each type III-V die and bonding seed layer, a wet etch process may be used to form conductive vias (since no hardened molding layer will be etched), thereby mitigating re-deposition of conductive materials in undesired locations. This, in part, increases stability and reliability of the VCSEL devices.

Referring to FIG. 1A, some embodiments of a three-dimensional integrated chip (3DIC) 100 with an III-V device structure 104 overlying a complementary metal-oxide-semiconductor (CMOS) IC 102 is provided.

The CMOS IC 102 may comprise an inter-level dielectric (ILD) structure 106 overlying a substrate 105 (in some embodiments, referred to as a CMOS substrate). The ILD structure 106 includes contact pads 108. In some embodiments, the contact pads 108 are electrically coupled by way of metal layers (not shown) (e.g., wires and vias) to semiconductor devices (not shown) (e.g., transistors) disposed over the substrate 105. A metal stack structure 110 overlies the ILD structure 106. A bond seed layer 112 overlies the metal stack structure 110 and a bond ring 114 overlies peripheral segments of the bond seed layer 112 and the metal stack structure 110. Bond bumps 116 are laterally offset the bond ring 114 and overlie the contact pads 108. In some embodiments, the bond bumps 116, bond seed layer 112, and the bond ring 114 comprise a same material (e.g., gold).

The III-V device structure 104 is disposed in a dielectric structure 132 and may comprise vertical cavity surface emitting laser (VCSEL) structures 111 overlying a stack of bonding layers 120. The VCSEL structure 111 comprises a first reflector 124, an optically active region 128, a second reflector 130, and sidewall spacers 126. Conductive vias 118 extend from the metal stack structure 110 to an upper surface of the second reflector 130 of the VCSEL structure 111. The conductive vias 118 are configured to electrically couple the second reflector 130 to the contact pads 108. The stack of bonding layers 120 are configured to facilitate bonding the III-V device structure 104 to the CMOS IC 102 during fabrication and electrically couple the first reflector 124 to the contact pad 108.

During an operation of the VCSEL structure 111, a bias is applied across the conductive via 118 and the stack of bonding layers 120, which causes the optically active region 128 to emit light 113. The first and second reflectors 124, 130 are positioned so that the generated light 113 reflects multiple times between the first and second reflectors 124, 130, and due to the effects of interference, some patterns and/or frequencies of light are amplified by constructive interference while other patterns and/or frequencies of light are attenuated by destructive interference. In this way, after multiple reflections back and forth between the first and second reflectors 124, 130, the light 113 passes out through a top surface of the VCSEL structure 111 with a pre-determine wavelength. In some embodiments, an aperture (not shown) is disposed between the conductive via 118 and the top surface of the VCSEL structure 111 such that the aperture directs emission of the light 113.

Figure 1B:
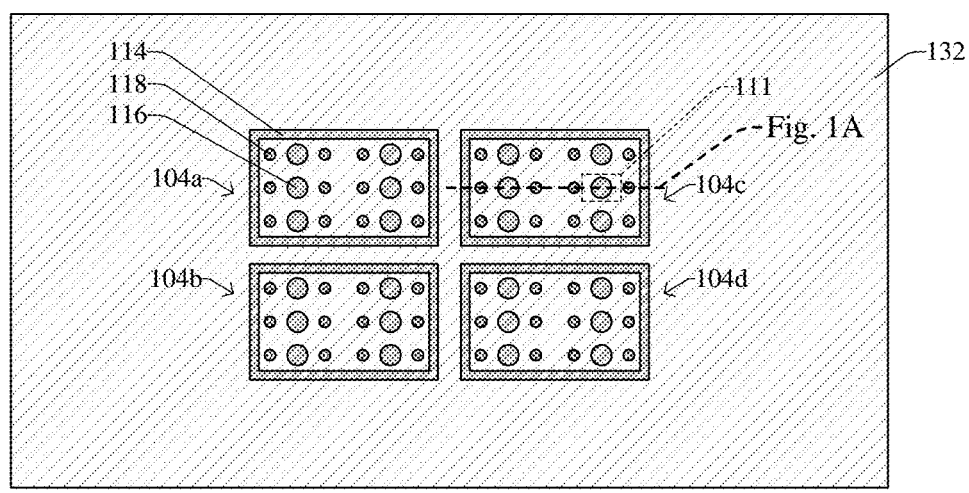
FIG. 1B illustrates some embodiments of a top view of the 3DIC of FIG. 1A, as indicated by the cut-lines in FIGS. 1A and 1B.

With reference to the top view of FIG. 1B, the bond ring 114 surrounds the VCSEL structures 111 and surrounds a group of bond bumps 116 (e.g., 6 bond bumps 116) such that the bond ring 114 is a continuous layer having approximately a same height as the bond bump 116. In some embodiments, the bond ring 114 may have a circular/elliptical or a polygon (e.g., triangle, square, rectangle, pentagon, hexagon, heptagon, octagon, etc.) shape when viewed from above. In some embodiments, the bond bumps 116 may have a circular/elliptical or a polygon (e.g., triangle, square, rectangle, pentagon, hexagon, octagon, etc.) shape when viewed from above. III-V device structures 104*a-d* respectively overlie the bond ring 114. By surrounding each group of bond bumps 116 with the bond ring 114, a molding layer will not form around the bond bumps 116 during fabrication of the 3DIC 100. This, in turn, allows for a wet etching process to be used in the formation of the conductive via 118 and thus mitigates the re-deposition of conductive materials on the VCSEL structure 111 during fabrication of the 3DIC 100, thereby increasing a reliability and stability of each VCSEL structure 111.

Figure 2A:
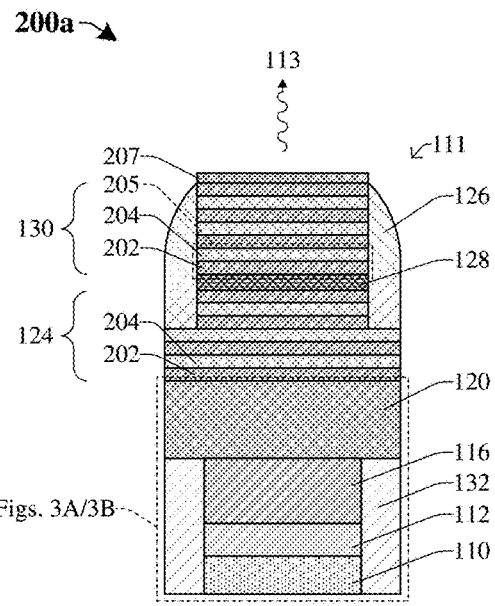
FIGS. 2A and 2B illustrate cross-sectional views of various embodiments of a vertical cavity surface emitting laser (VCSEL) structure overlying a bonding structure.

Referring to FIG. 2A, a cross-sectional view 200*a* of various embodiments of the VCSEL structure 111 and underlying layers of FIG. 1A is provided.

The first and second reflectors 124, 130 are comprised of alternating layers of two different materials with different refractive indices. The stack of alternating layers comprise a first layer 202 and a second layer 204. In some embodiments, the first and second layers 202, 204 may respectively be comprised of different concentrations of aluminum gallium arsenide (AlGaAs). For example, the first layer 202 may comprise $Al_xGaAs$ such that x is within a range of 0 to 0.9, the second layer 204 may comprise $Al_yGaAs$ such that y is within a range of 0.1-0.99, and such that x is a different value than y. For example, the first layer 202 may comprise GaAs and the second layer 204 may comprise AlAs. In some embodiments, the first and second reflectors 124, 130 are each comprised of between 1 to 100 pairs of alternating layers of the first and second layers 202, 204. In some embodiments, the optically active region 128 may, for example, be or comprise indium gallium arsenide ($In_zGaAs)_w$ where z is within a range of approximately 0.1 to 0.9 and w is within a range of approximately 1 to 5. The optically active region 128 may, for example, have a thickness within a range of approximately 1 to 20 nanometers.

In some embodiments, the first and second reflectors 124, 130 may respectively be distributed Bragg reflectors (DBRs) containing a stack of pairs 205. The stack of pairs 205 includes the first layer 202 and the second layer 204. Each pair 205 may be about one-half a wavelength thick, where the wavelength corresponds to a wavelength of light 113 emitted from the VCSEL structure 111. For example, if the wavelength emitted from the VCSEL structure 111 is 800 nanometers then the pair 205 has a thickness of approximately 400 nanometers. Each individual layer, first layer 202 and second layer 204, may be about one-fourth the wavelength thick. In some embodiments, the first layer 202 may have a thickness within a range of approximately 4 to 100 nanometers and/or the second layer 204 may have a thickness within a range of approximately 4 to 100 nanometers. An etch stop layer 207 may overlie the second reflector 130. The etch stop layer 207 may, for example, be or comprise silicon carbide, silicon nitride, or the like. The sidewall spacers 126 have rounded upper corners and may, for example, be or comprise a nitride, such as titanium nitride or silicon nitride. In some embodiments, the etch stop layer 207 may be omitted (not shown).

Figure 2B:
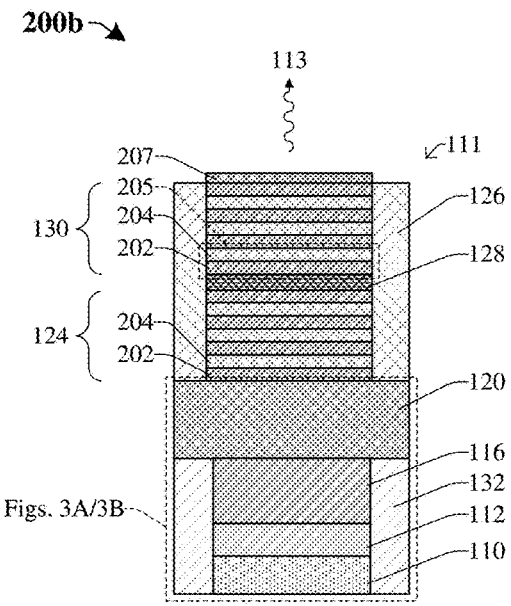

Referring to FIG. 2B, a cross-sectional view 200*b* of various embodiments of the VCSEL structure 111 of FIG.

2A is provided in which outer sidewalls of the first and second reflectors 124, 130 are aligned with one another.

Figure 3A:
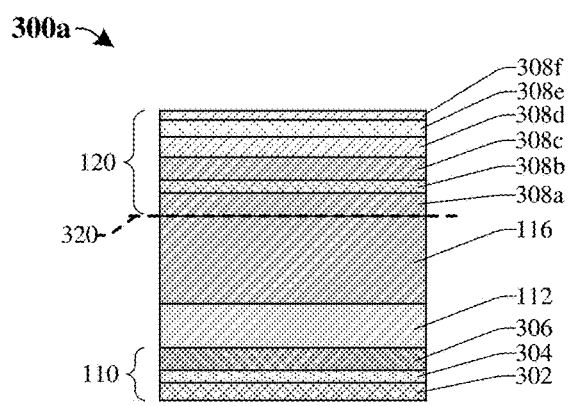
FIGS. 3A and 3B illustrate cross-sectional views of various embodiments of the bonding structure of FIGS. 2A and 2B.

Referring to FIG. 3A, a cross-sectional view 300a of various embodiments of layers underlying the VCSEL structure 111 of FIG. 2A is provided.

In some embodiments, the metal stack structure 110 comprises a first metal layer 302, a second metal layer 304, and a third metal layer 306. The first metal layer 302 may, for example, be or comprise titanium, tantalum, or the like and/or may, for example, have a thickness within a range of about 250 to 350 nanometers. The second metal layer 304 may, for example, be or comprise copper, aluminum, or the like and/or may, for example, have a thickness within a range of about 40 to 60 nanometers. The third metal layer 306 may, for example, be or comprise titanium, tungsten, titanium tungsten, or the like and/or may, for example, have a thickness within a range of about 300 to 340 nanometers. The bond seed layer 112 may, for example, be or comprise gold, copper, aluminum, or the like and/or may, for example, have a thickness within a range of about 130 to 170 nanometers. The bond bump 116 may, for example, be or comprise gold, copper, aluminum, or the like and/or may, for example, have a thickness within a range of about 0.9 to 1.1 micrometers. In some embodiments, during formation of the metal stack structure 110, the bond seed layer 112, and the bond bump 116, the aforementioned structures (110, 112, and 116) are not exposed to an annealing process.

In some embodiments, the stack of bonding layers 120 comprises individual bonding layers 308a-f. The bonding layer 308a may, for example, be or comprise gold and/or may, for example, have a thickness within a range of about 150 to 250 nanometers. In some embodiments, the bonding layer 308a and the bond bump 116 meet at a bond interface 320. The bond interface 320 may comprise a metallic bond, for example, a gold-gold bond. The bonding layer 308b may, for example, be or comprise titanium, tantalum, or the like and/or may, for example, have a thickness within a range of about 4 to 6 nanometers. The bonding layer 308c may, for example, be or comprise gold and/or may, for example, have a thickness within a range of about 150 to 250 nanometers. The bonding layer 308d may, for example, be or comprise nickel and/or have a thickness within a range of about 20 to 30 nanometers. The bonding layer 308e may, for example, be or comprise germanium, gold, germanium gold, or the like and/or may, for example, have a thickness within a range of about 80 to 120 nanometers. The bonding layer 308f may, for example, be or comprise nickel and/or have a thickness within a range of about 2 to 3 nanometers. In some embodiments, during formation of the bonding layers 308a, 308b, the aforementioned layers are not exposed to an annealing process. In yet another embodiment, during formation of the bonding layers 308c-f, the aforementioned layers are exposed to an annealing process.

In some embodiments, the bonding layer 308a is configured to facilitate the metallic bond at the bond interface 320. The bonding layers 308b-f may be configured to achieve an ohmic contact between the bonding layer 308a and the VCSEL structure (111 of FIG. 2A).

Figure 3B:
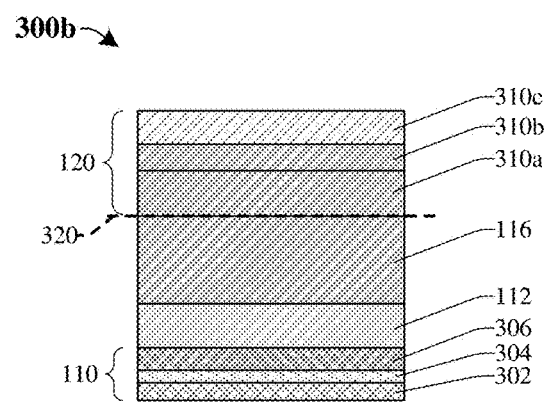

Referring to FIG. 3B, a cross-sectional view 300b of various embodiments of the structure of FIG. 3A is provided.

In some embodiments, the stack of bonding layers 120 comprises individual bonding layers 310a-c. The bonding layer 310a may, for example, be or comprise gold and/or have a thickness within a range of about 0.5 to 5 micrometers. The bonding layer 310b may, for example, be or comprise gold and/or have a thickness within a range of about 50 to 800 nanometers. The bonding layer 310c may, for example, be or comprise nickel, gold, nickel gold, or the like and/or have a thickness within a range of about 50 to 500 nanometers.

In some embodiments, the bonding layer 310a is configured to facilitate the metallic bond at the bond interface 320. The bonding layers 310b-c may be configured to achieve an ohmic contact between the bonding layer 310a and the VCSEL structure (111 of FIG. 2A).

Figure 4A:
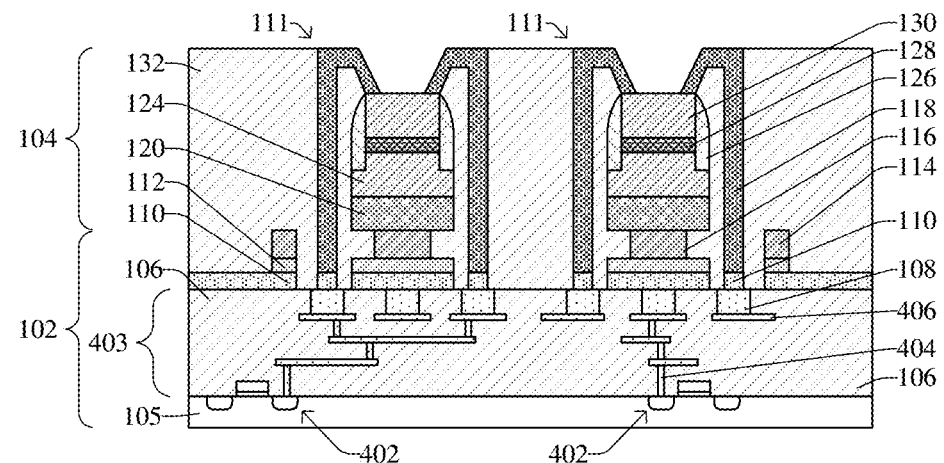
FIGS. 4A-4D illustrate cross-sectional views of various embodiments of the 3DIC of FIG. 1A.

Referring to FIG. 4A, a cross-sectional view of some additional embodiments of a 3DIC 400a comprising an III-V device structure 104 overlying a complementary metal-oxide-semiconductor (CMOS) IC 102 is provided.

The CMOS IC 102 includes an interconnect structure 403 overlying a substrate 105.

Semiconductor devices 402 (e.g., transistors) are disposed over the substrate 105. For example, if the semiconductor devices 402 are configured as transistors, they respectively comprise a gate electrode overlying a gate dielectric, and source/drain regions disposed on opposite ends of the gate electrode. The interconnect structure 403 comprises an inter-level dielectric (ILD) structure 106, interconnect vias 404, interconnect wires 406, and contact pads 108. The interconnect vias and wires 404, 406, and contact pads 108 are configured to electrically couple the semiconductor devices 402 to the VCSEL structures 111. In some embodiments, the conductive vias 118 are electrically coupled to the semiconductor devices 402 by way of the interconnect structure 403.

Figure 4B:
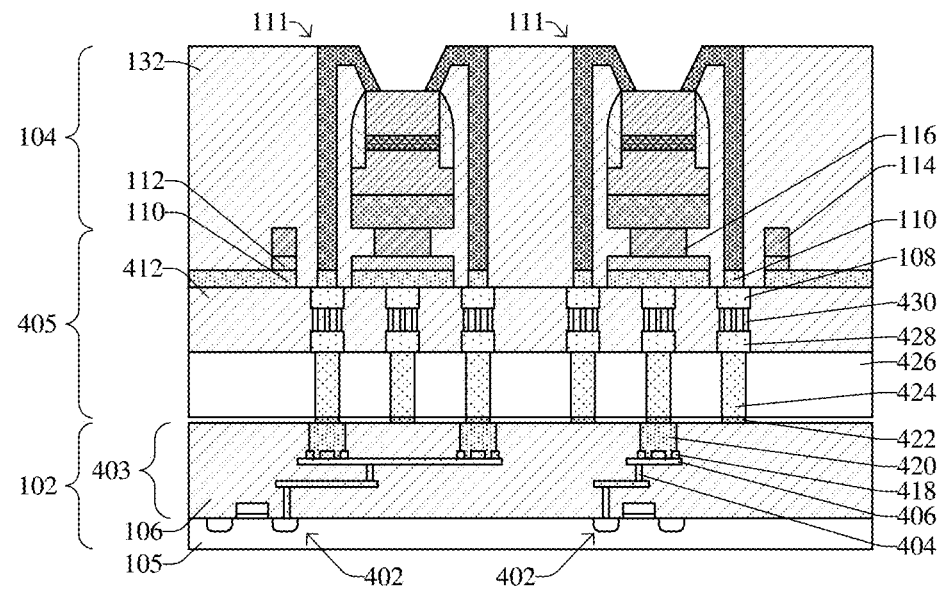

Referring to FIG. 4B, a cross-sectional view of a 3DIC 400b corresponding to various embodiments of the 3DIC 400a of FIG. 4A is provided.

A die 405 is disposed between the III-V device structure 104 and the CMOS IC 102. The die 405 comprises an upper ILD structure 412 disposed between the metal stack structure 110 and a carrier substrate 426 (e.g., an interposer substrate). Interconnect vias 430 are disposed between the contact pads 108 and lower contact pads 428. A plurality of through substrate vias (TSVs) 424 extend through the carrier substrate 426 and electrically couple a plurality of solder bumps 422 to the lower contact pads 428. In some embodiments, one or more redistribution layers (not shown) may be disposed between the TSVs 424 and the solder bumps 422 and/or one or more redistribution layers (not shown) may be disposed between the TSVs 424 and the lower contact pads 428.

The solder bumps 422 directly overlie bonding pads 420 disposed within the ILD structure 106. The bonding pads 420 are electrically coupled to a top interconnect wire layer 406 such that the bonding pads 420 are electrically coupled to the semiconductor devices 402. A passivation layer 418 is disposed between the bonding pads 420 and the top interconnect wire layer 406. Thus, the die 405 is configured to electrically couple the VCSEL structures 111 to the semiconductor devices 402.

Figure 4C:
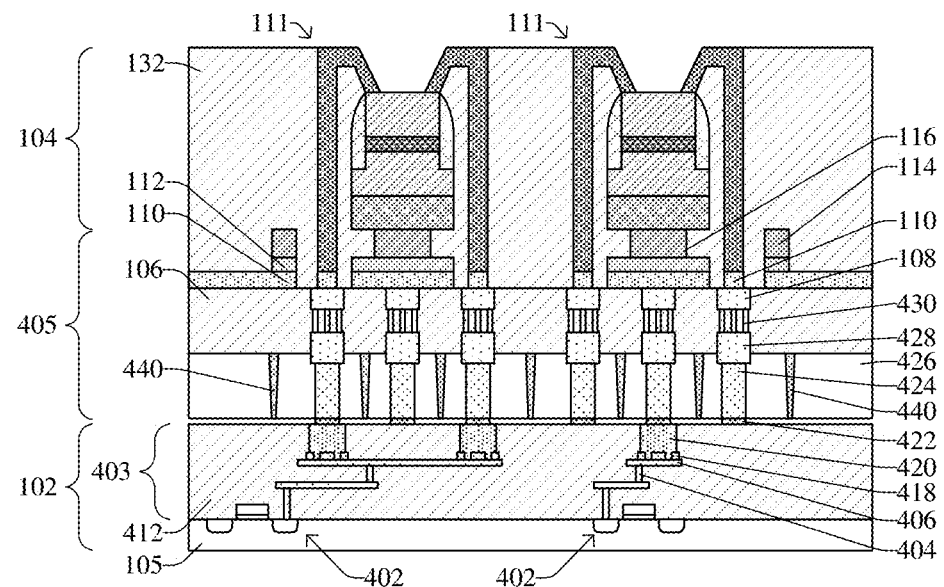

Referring to FIG. 4C, a cross-sectional view of a 3DIC 400c corresponding to various embodiments of the 3DIC 400b of FIG. 4B is provided.

Isolation structures 440 are formed between the TSVs 424 to provide electrical isolation between adjacent TSVs 424. In some embodiments, the isolation structures 440 respectively may extend from an upper surface of the carrier substrate 426 to a lower surface of the carrier substrate 426.

Figure 4D:
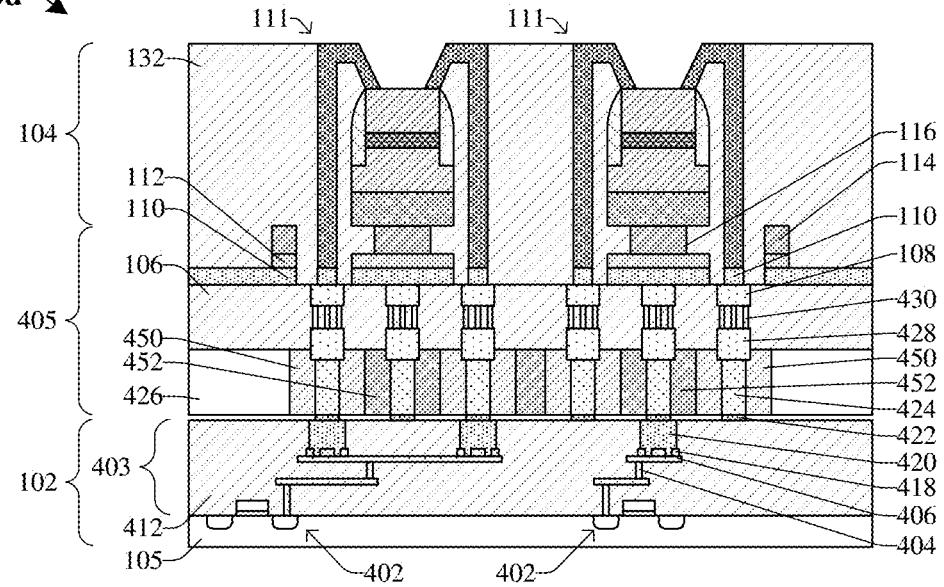

Referring to FIG. 4D, a cross-sectional view of a 3DIC 400d corresponding to various embodiments of the 3DIC 400b of FIG. 4B is provided.

A first doped region 450 and a second doped region 452 are doped regions of the carrier substrate 426. In some embodiments, the first and second doped regions 452 extend from an upper surface of the carrier substrate 426 to a lower surface of the carrier substrate 426. The first doped region 450 comprises a first doping type (e.g., n-type), and the second doped region 452 comprises a second doping type (e.g., p-type) such that the first doping type is opposite the second doping type. A formation of depletion regions at outer regions of the first and second doped regions 450, 452 facilitates electrical isolation between the first and second doped regions 450, 452 and adjacent regions of the carrier substrate 426. Thus, the first and second doped regions 450, 452 are configured to electrically isolate the TSVs 424 from one another, thereby enhancing stability and reliability of the VCSEL structures 111.

Figure 5:
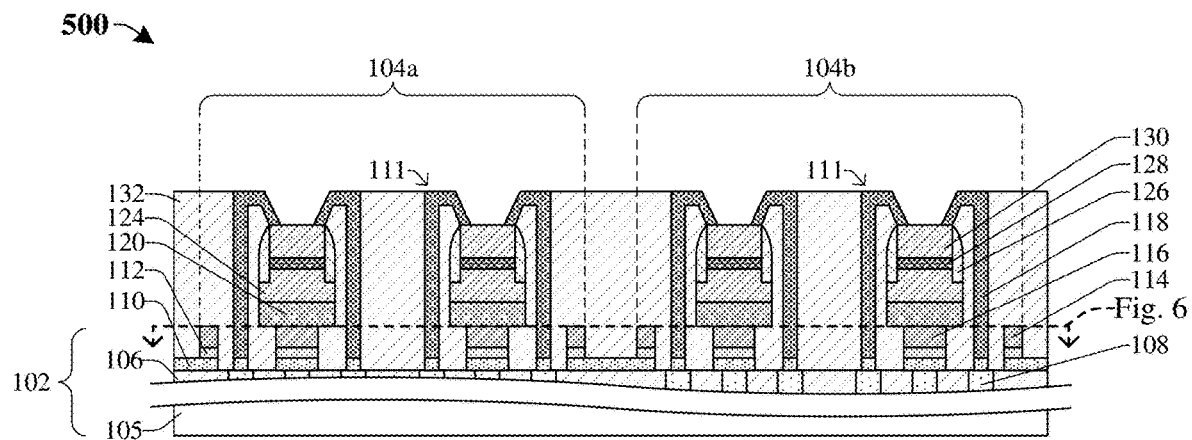
FIG. 5 illustrates a cross-sectional view of some embodiments of a three-dimensional integrated chip (3DIC) comprising a CMOS IC and an III-V device structure.

Referring to FIG. 5, some embodiments of a three-dimensional integrated chip (3DIC) 500 with III-V device structures 104a-b overlying a complementary metal-oxide-semiconductor (CMOS) IC 102 is provided.

The III-V device structures 104a-b respectively comprises VCSEL structures 111 and each overlie a bond ring 114. Each III-V device structure 104a-b is confined within outer sidewalls of bond ring 114. In some embodiments, the metal stack structure 110 continuously extends between each bond ring 114.

Figure 6:
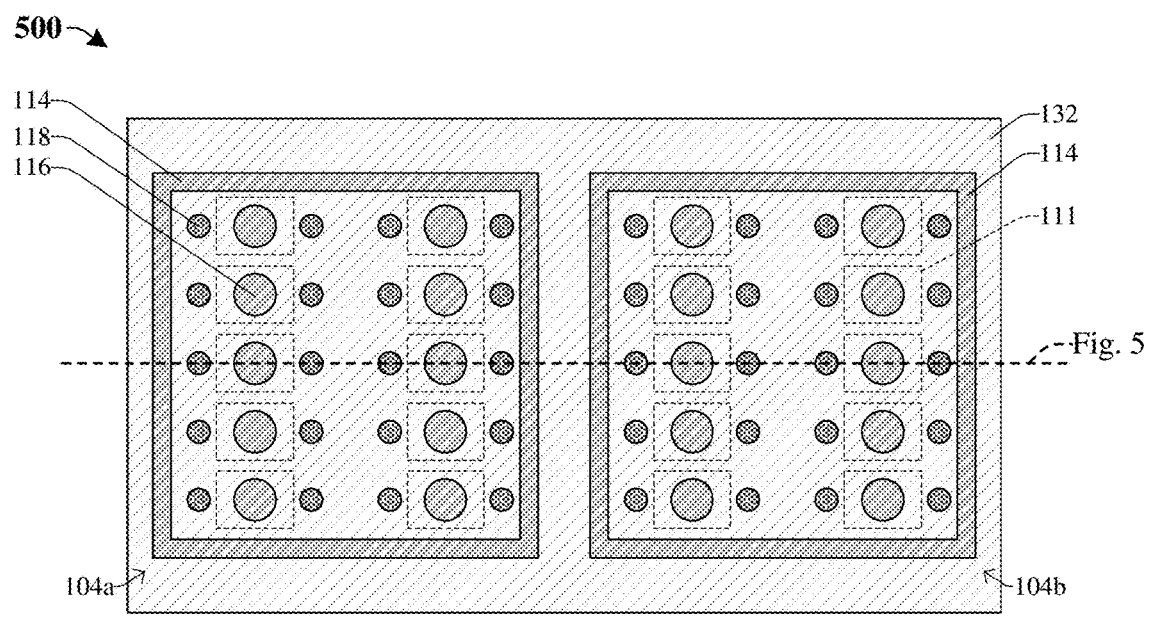
FIG. 6 illustrates some embodiments of a top view of the 3DIC of FIG. 5, as indicated by the cut-lines in FIGS. 5 and 6.

Referring to FIG. 6, a top view of some embodiments of the 3DIC 500 of FIG. 5 according to the cut-lines in FIGS. 5 and 6 is provided.

As illustrated in FIG. 6, each III-V device structure 104a-b comprises a plurality of VCSEL structures (e.g., 10 VCSEL structures 111) respectively overlying a bond bump 116. The plurality of VCSEL structures 111 within each III-V device structure 104a-104b are laterally between inner sidewalls of each bond ring 114. By surrounding each III-V device structure 104a-b with the bond ring 114, a molding layer (not shown) will be confined to regions laterally outside of (e.g., laterally offset outer sidewalls of) each bond ring 114 during fabrication of the 3DIC 500. This, in part, mitigates the re-deposition of conductive materials on the VCSEL structures 111 during fabrication of the 3DIC 500, thereby increasing a stability and reliability of each VCSEL structure 111.

FIGS. 7-19 illustrate various views 700-1900 of some embodiments of a method of forming a three-dimensional integrated chip (3DIC) comprising a complementary metal-oxide-semiconductor (CMOS) IC and III-V device structures according to the present disclosure. Although the views 700-1900 shown in FIGS. 7-19 are described with reference to a method, it will be appreciated that the structures shown in FIGS. 7-19 are not limited to the method but rather may stand alone separate of the method. Although FIGS. 7-19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
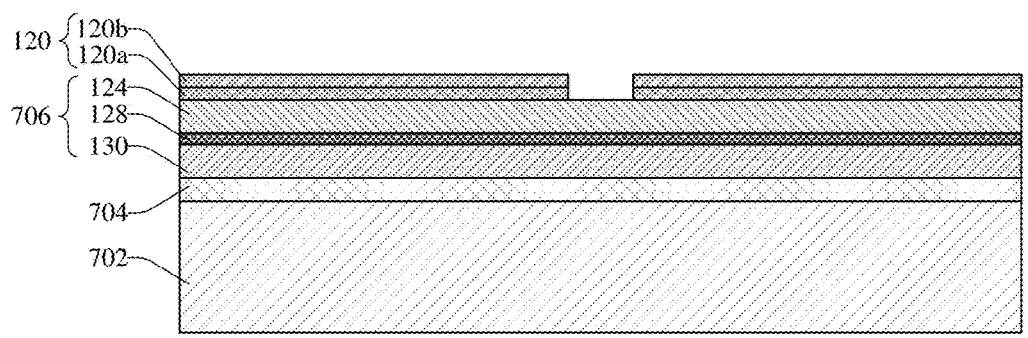
FIGS. 7 through 19 illustrate various views describing a method of fabricating a 3DIC according to the present disclosure.

As shown in cross-sectional view 700 of FIG. 7, a carrier substrate 702 is provided and a dielectric layer 704 is grown over the carrier substrate 702. In some embodiments, the carrier substrate 702 may, for example, be or comprise gallium, arsenic, gallium arsenide, or the like and/or be formed with a thickness within a range of about 150 to 250 micrometers. The dielectric layer 704 may, for example, be or comprise an oxide of the carrier substrate 702. An III-V structure 706 is formed by an epitaxial process over the carrier substrate 702. The III-V structure 706 comprises a first reflector 124, an optically active region 128, and a second reflector 130. The first reflector 124, optically active region 128, and second reflector 130 may, for example, respectively comprise III-V materials. The first reflector 124 may be doped with a first doping type (e.g., n-type), and the second reflector 130 may be doped with a second doping type (e.g., p-type). The first doping type is opposite the second doping type.

A stack of bonding layers 120 is formed over the first reflector 124. The stack of bonding layers 120 may, for example, comprise the bonding layers 308a-f of FIG. 3A or comprise the bonding layers 310a-c of FIG. 3B. The stack of bonding layers 120 comprises a first bonding layer 120b overlying a first bonding structure 120a. In some embodiments, the first bonding layer 120b may, for example, be the bonding layer 308a of FIG. 3A or the bonding layer 310a of FIG. 3B. In some embodiments, the first bonding structure 120a may, for example, comprise the bonding layers 308b-f of FIG. 3A or comprise the bonding layers 310b-c.

Figure 8:
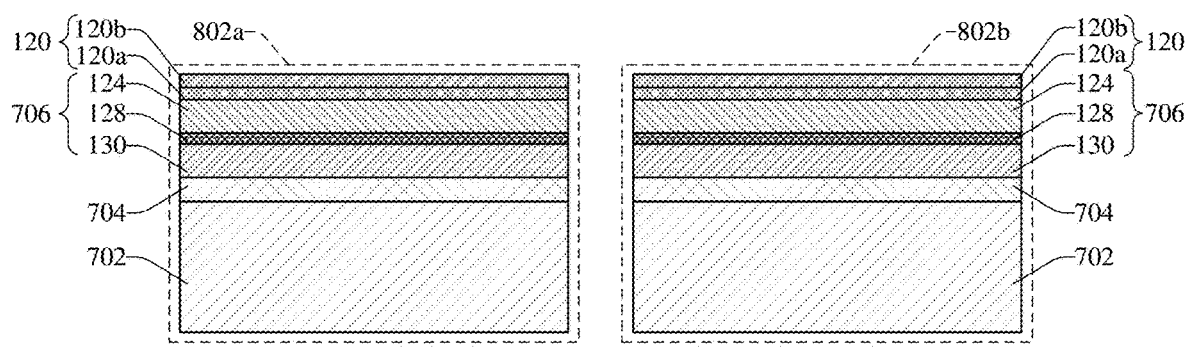

As shown in cross-sectional view 800 of FIG. 8, a removal process is performed on the structure of FIG. 7, thereby forming a first III-V die 802a and a second III-V die 803a. In some embodiments, the removal process is performed by forming a masking layer over the first reflector 124, exposing unmasked regions of the first reflector 124 and underlying layers to one or more etchants, and removing the masking layer (not shown). In other embodiments, the removal process may comprise a dicing process performed with a saw.

Figure 9:
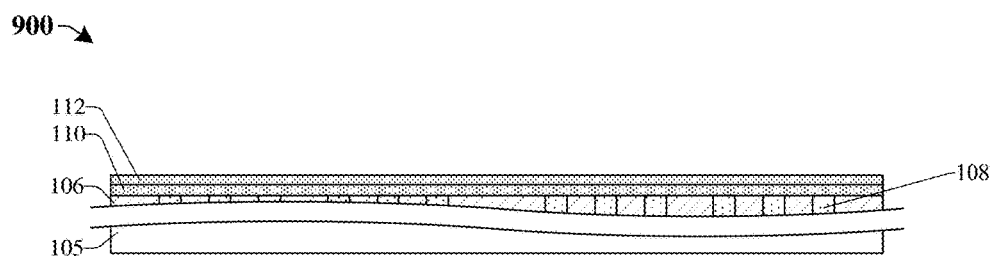

As shown in cross-sectional view 900 of FIG. 9, an inter-level dielectric (ILD) structure 106 is formed over a substrate 105. Contact pads 108 are formed at an upper surface of the ILD structure 106. A metal stack structure 110 is formed over the ILD structure 106, and a bond seed layer 112 is formed over the metal stack structure 110. The bond seed layer 112 may, for example, be or comprise gold, aluminum, copper, or the like.

Figure 10A:
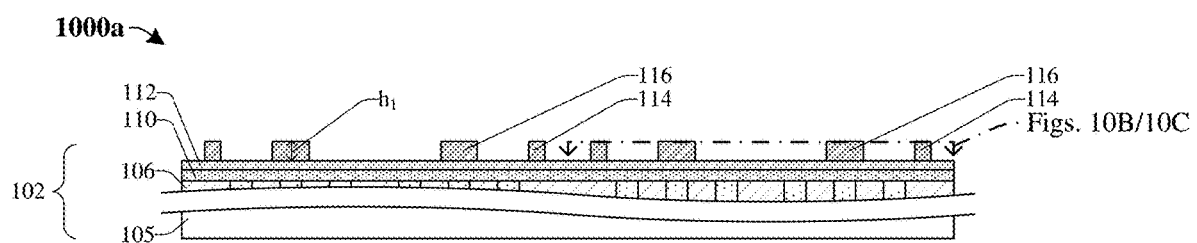

As shown in cross-sectional view 1000a of FIG. 10A, bond bumps 116 and bond rings 114 are formed over the bond seed layer 112, thereby defining a complementary metal-oxide-semiconductor (CMOS) integrated chip (IC) 102. In some embodiments, the bond bumps 116 and the bond rings 114 are formed by an electro chemical plating (ECP) process. During the ECP process, the bond seed layer 112 may, for example, act as a seed layer for the bond bumps 116 and/or the bond rings 114. The bond bumps 116 and the bond rings 114 may be formed concurrently, or the bond bumps 116 may be formed after forming the bond rings 114. The bond bumps 116 are respectively confined within inner sidewalls of the bond ring 114. The bond bumps 116 and the bond rings 114 may, for example, be or comprise a same material as the bond seed layer 112 (e.g., gold). The bond bumps 116 and the bond rings 114 may respectively have a same height hi. The height hi may, for example, be within a range of about 0.9 to 1.1 micrometers.

Figure 10B:
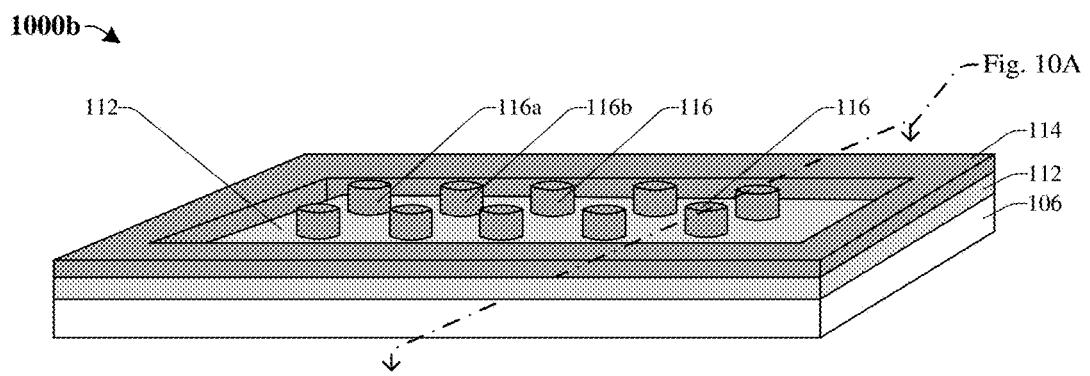

FIG. 10B shows a perspective view 1000b corresponding to some embodiments of the cross-sectional view 1000a of FIG. 10A. The dashed line in FIG. 10A shows where the perspective view 1000b of FIG. 10B is located. FIG. 10B shows the bond bumps 116 are confined within inner sidewalls of the bond ring 114. The bond bumps 116 are laterally offset from one another and/or inner sidewalls of the bond ring 114 by a non-zero distance. The bond bumps 116 may be disposed in an array of rows and columns. In some embodiments, the bond bumps 116 respectively have a cylinder, cube, cuboid, or triangular prism shape. In yet further embodiments, a first bond bump 116a may have a different shape than a second bond bump 116b. For example, the first bond bump 116a may have a cuboid shape (not shown) and the second bond bump 116b may have a cylinder shape.

Figure 10C:
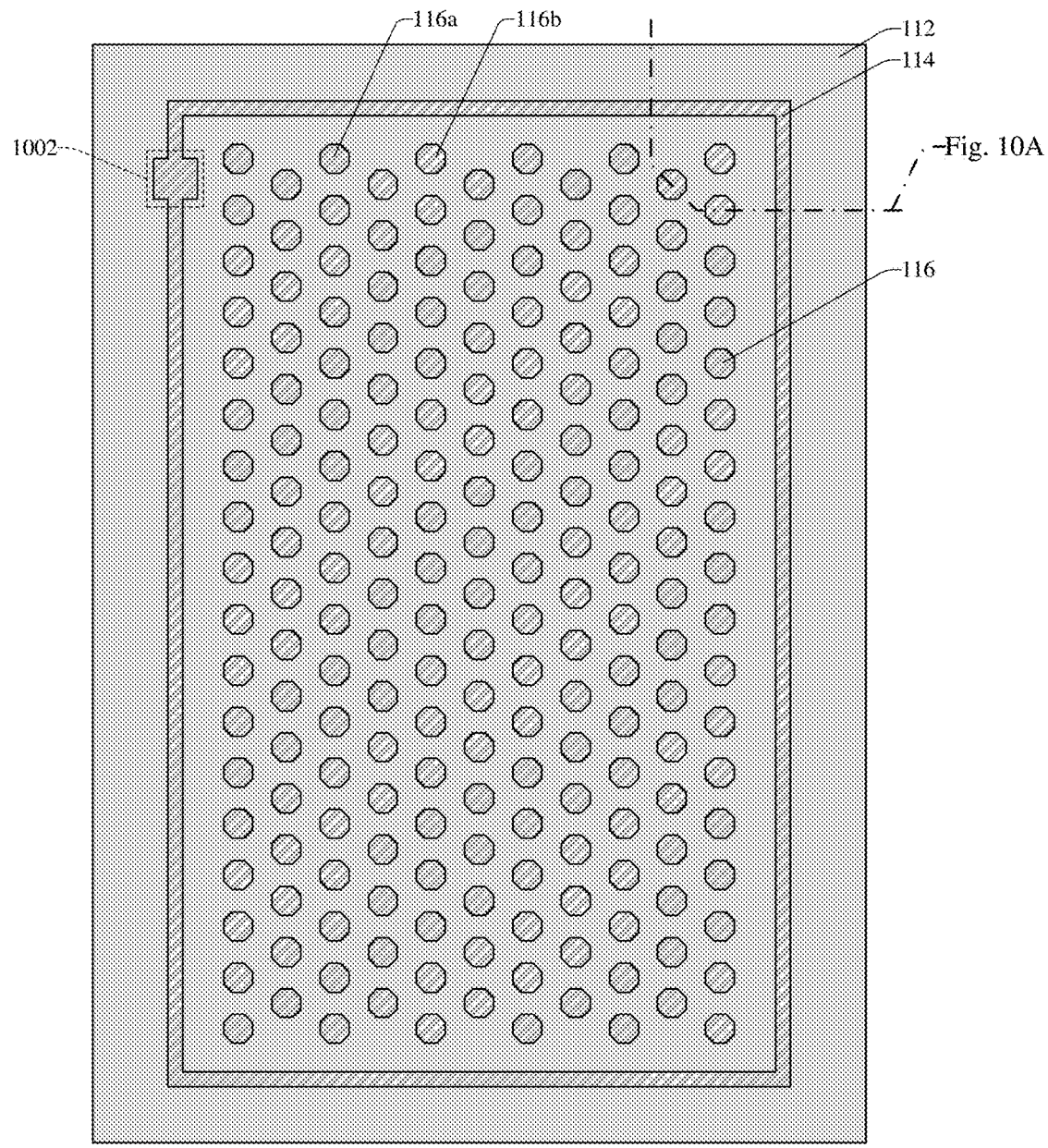

FIG. 10C shows a top view 1000c corresponding to some alternative embodiments of the cross-sectional view 1000a of FIG. 1A. The dashed line in FIG. 10A shows where the top view 1000c of FIG. 10C is located. FIG. 10C shows the bond bumps 116 are confined within inner sidewalls of the bond ring 114. The bond bumps 116 are laterally offset from one another and/or inner sidewalls of the bond ring 114 by one or more non-zero distances. The bond bumps 116 may be disposed in an array of rows and columns. The bond bumps 116 may, for example, respectively have an octagon shape when viewed from above. In some alternative embodiments, the bond bumps 116 may respectively have a circular/elliptical or a polygon (e.g., triangle, square, rectangle, pentagon, hexagon, octagon, etc.) shape when viewed from above. In yet further embodiments, the bond bumps 116 may have any combination of shapes when viewed from above. For example, a first bond bump 116a may have a circular/elliptical shape when viewed from above (not shown) and a second bond bump 116b may have an octagon shaped when viewed from above. In some embodiments, the bond ring 114 may have an alignment mark region 1002, such that an alignment mark may be formed on an upper surface of the bond ring 114 in the alignment mark region 1002 and/or the alignment mark may be formed under the bond ring 114. The alignment mark formed in the alignment mark region 1002 may be used during a bonding process of the CMOS IC die (102 of FIG. 10A) with an III-V die (e.g., 802a or 802b of FIG. 8).

Figure 11:
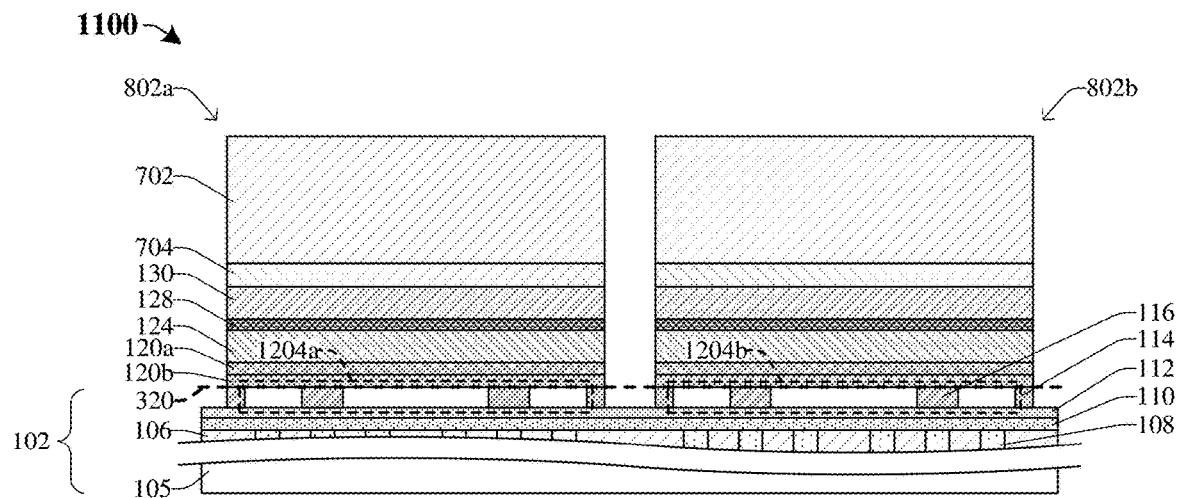

As shown in cross-sectional view 1100 of FIG. 11, the first and second III-V dies 802a, 802b are respectively bonded to the bond ring 114 at a bond interface 320. The bonding process seals a first cavity 1204a and a second cavity 1204b. The first cavity 1204a is defined between a bottom surface of the first III-V die 802a and the top surface of the bond seed layer 112. The second cavity 1204b is defined between a bottom surface of the second III-V die 802b and the top surface of the bond seed layer 112. In some embodiments, during the bonding process the first and second III-V dies 802a, 802b are respectively aligned over each bond ring 114 by virtue of the alignment mark region (1002 of FIG. 10C). The bonding process may, for example, include: applying a force to an upper surface of the first and second III-V dies 802a, 802b, performing an annealing process, and/or performing an ultrasonic bonding process. In some embodiments, the application of force, annealing process, and the ultra-sonic bonding process may be performed concurrently with one another. The force may, for example, be within a range of about 13 to 17 newtons (N). The annealing process may, for example, reach a maximum temperature within a range of about 280 to 320 degrees Celsius. During the ultrasonic bonding process, one or more sonic or ultrasonic energy generators, such as transducers, are arranged on sidewalls of the first and second III-V dies 802a, 802b and/or on sidewalls or a lower surface of the CMOS IC 102. The one or more sonic or ultrasonic energy generators are configured to generate a pressure wave through the first and second III-V dies 802a, 802b and/or the CMOS IC 102. The ultrasonic bonding process may, for example, be performed with a maximum power within a range of about 6 to 10 watts (W). The ultrasonic bonding process may mitigate bonding seam defects at the bond interface 320 by reducing vibrations during the bonding process. In some embodiments, the first bonding layer 120b, the bond rings 114, and the bond bumps 116 may respectively comprise a same material (e.g., gold). Thus, the bond interface 320 may comprise a metallic bond (e.g., a gold to gold bond). In some embodiments, before performing the bonding process, the metal stack structure 110, the bond seed layer 112, and the bond bump 116 are not exposed to any annealing process. This, in part, may increase a strength of the metallic bond at the bond interface 320.

Figure 12:
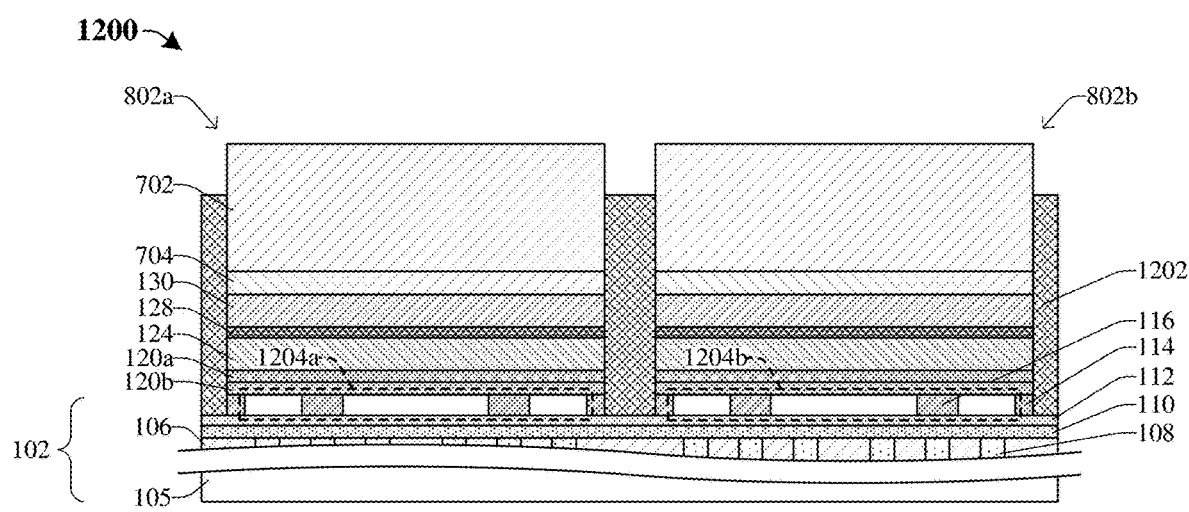

As shown in cross-sectional view 1200 of FIG. 12, a molding layer 1202 is formed over the bond seed layer 112. The bond rings 114 are configured to block the molding layer 1202 from being formed below the first and second III-V dies 802a, 802b. For example, the bond rings 114 are configured to prevent formation of the molding layer 1202 in the first and second cavities 1204a, 1204b. In some embodiments, the molding layer 1202 does not exist between an upper surface of the bond seed layer 112 and a bottom surface of the first and second III-V dies 802a, 802b, respectively. In further embodiments, the molding layer 1202 does not form within inner sidewalls of the bond rings 114. In some embodiments, the molding layer 1202 may, for example, be an epoxy molding material, a polyimide, or the like.

Figure 13:
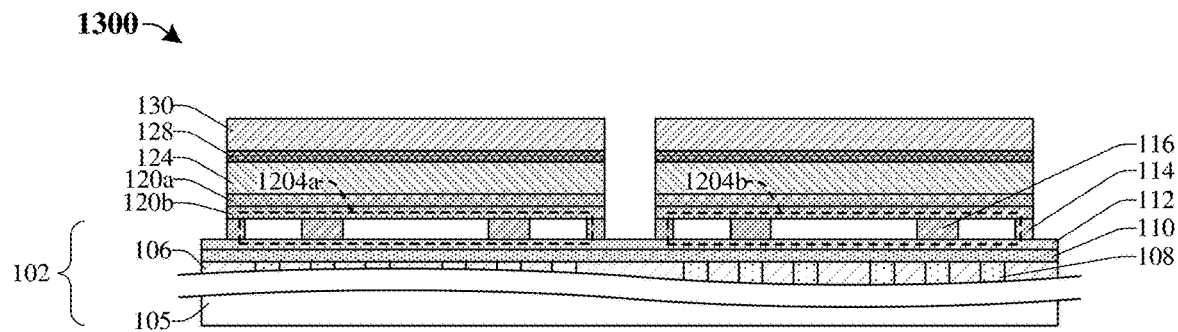

As shown in cross-sectional view 1300 of FIG. 13, a removal process is performed to remove the molding layer (1202 of FIG. 12), the carrier substrate (702 of FIG. 12), and the dielectric layer (704 of FIG. 12). In some embodiments, the removal process may include performing a grinding process, one or more etching process(es), and/or one or more planarization process(es) (e.g., a chemical mechanical planarization (CMP) process). In some embodiments, after performing the removal process, residue of the molding layer 1202 does not exist in the first and/or second cavities 1204a, 1204b.

Figure 14:
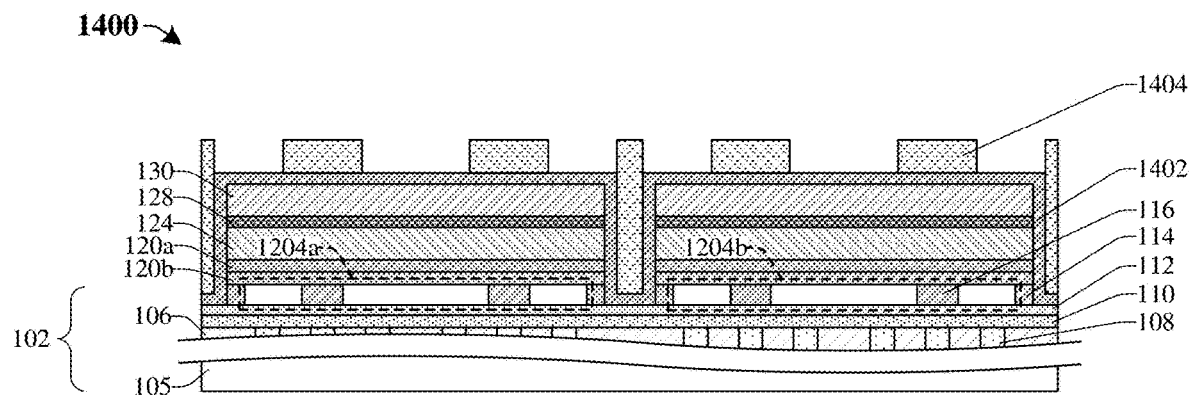

As shown in cross-sectional view 1400 of FIG. 14, a hard mask layer 1402 is formed over the second reflector 130 and the bond seed layer 112. A photoresist 1404 is formed over the hard masking layer 1402.

Figure 15:
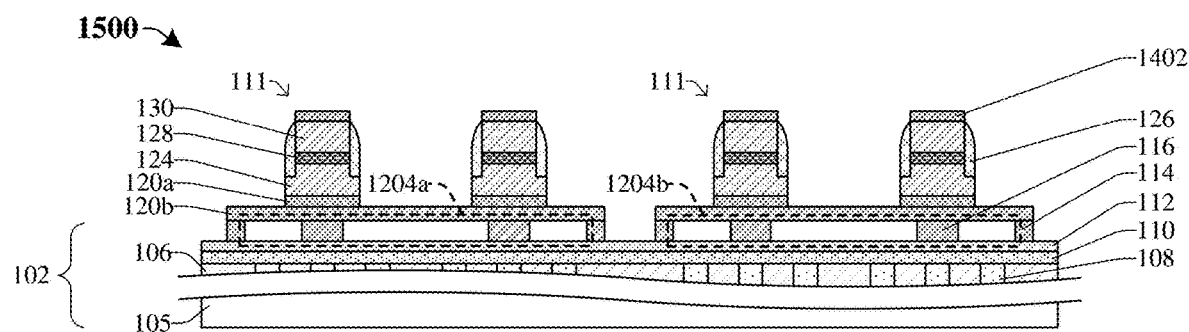

As shown in cross-sectional view 1500 of FIG. 15, an etching process is performed on the structure of FIG. 14. The etching process may comprise one or more plasma etches and/or one or more wet etches. Further, sidewall spacers 126 are formed around sidewalls of the first and second reflectors 124, 130 and/or sidewalls of the optically active region 128, thereby defining vertical cavity surface emitting laser (VCSEL) structures 111.

Figure 16:
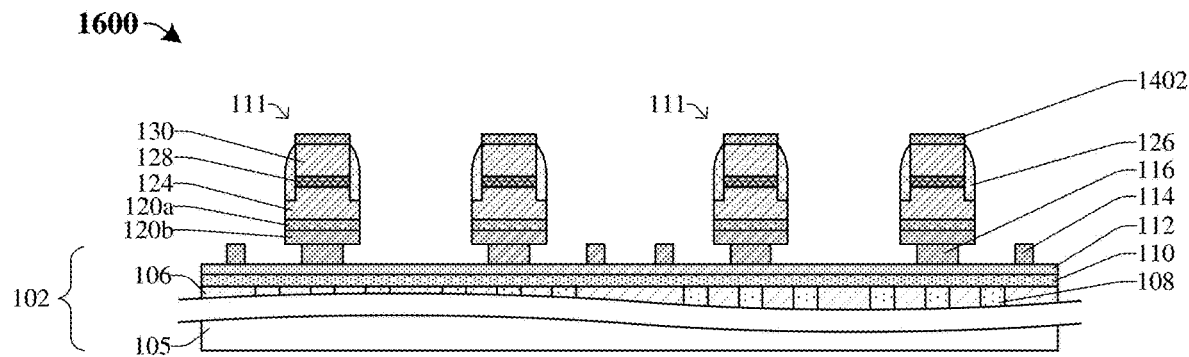

As shown in cross-sectional view 1600 of FIG. 16, an etching process is performed to remove portions of the first bonding layer 120b, thereby unsealing the first and second cavities (1204a, 1204b of FIG. 15).

Figure 17:
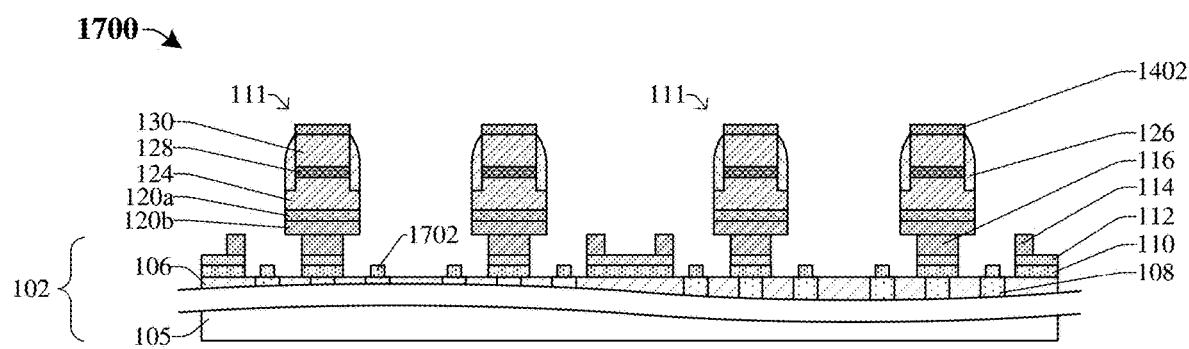

As shown in cross-sectional view 1700 of FIG. 17, an etching process is performed on the metal stack structure 110 and the bond seed layer 112. A segment 1702 of the metal stack structure 110 overlies each contact pad 108. In some embodiments, the etching process is a wet etch process configured to prevent re-deposition of conductive materials on sidewalls of the VCSEL structures 111.

Figure 18:
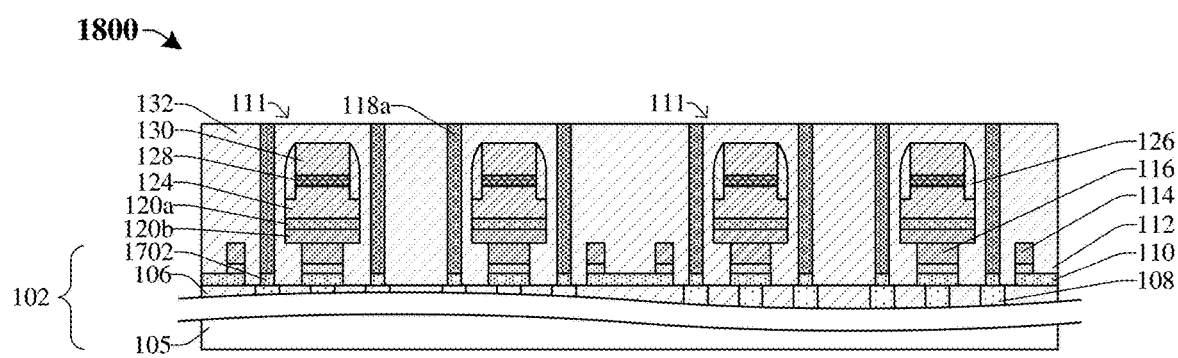

As shown in cross-sectional view 1800 of FIG. 18, a dielectric structure 132 is formed over the ILD structure 106. Vertical via segments 118a are formed over the metal stack structure 110 on opposing sides of each VCSEL structure 111. The vertical via segments 118a are electrically coupled to the contact pads 108 by way of the metal stack structure 110. In some embodiments, a process for forming the vertical via segments 118a may include: forming a masking layer (not shown) over the dielectric structure 132, patterning the dielectric structure 132 according to the masking layer to define openings that correspond to a shape of the vertical via segments 118a, filling the openings with a conductive material (e.g., copper), and removing the masking layer (e.g., using a chemical mechanical planarization process). In some embodiments, the vertical via segments 118a may, for example, be or comprise copper, aluminum, or the like.

Figure 19:
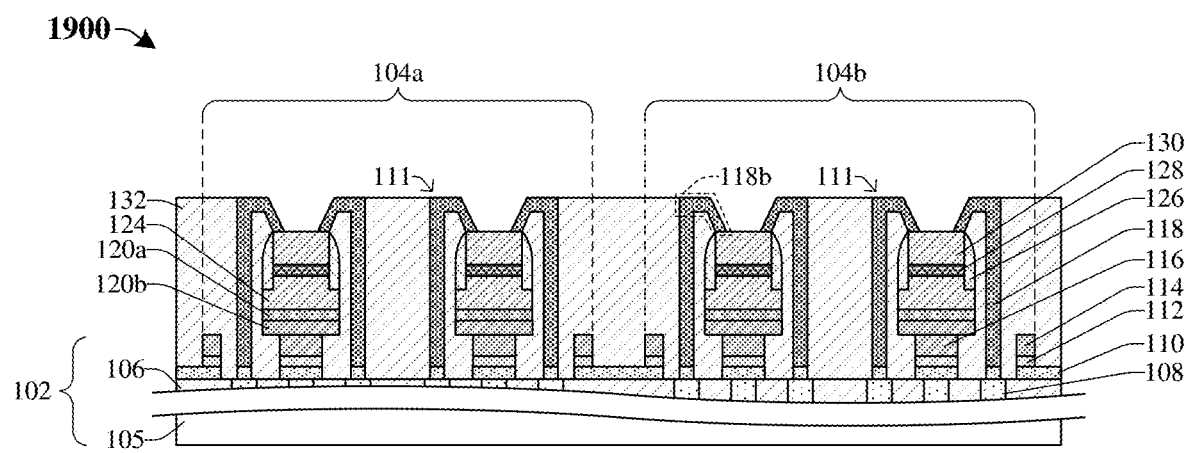

As shown in cross-sectional view 1900 of FIG. 19, an upper segment 118b of conductive vias 118 are formed, thereby electrically coupling the second reflectors 130 to the contact pads 108. In some embodiments, the dielectric structure 132 may be selectively patterned by, for example, photolithography methods (not shown). Subjecting the structure of FIG. 18 to an etching process selectively removes dielectric material to form vertical connection trenches that expose a top surface of the second reflectors 130, and to form horizontal connection trenches that connect the vertical trenches to the vertical via segments (118a of FIG. 18). The etched structure creates a mold cavity for conductive materials to be formed to create the upper segment 118b, thereby defining the conductive vias 118. After being formed, for example, by sputtering, ECP, or other suitable methods, a CMP is carried out to planarize the upper surfaces of the conductive vias 118 and/or to remove excess of the conductive materials from over a top of the dielectric structures 132. Further, the etching process may expose an upper surface of each VCSEL structure 111.

Figure 20:
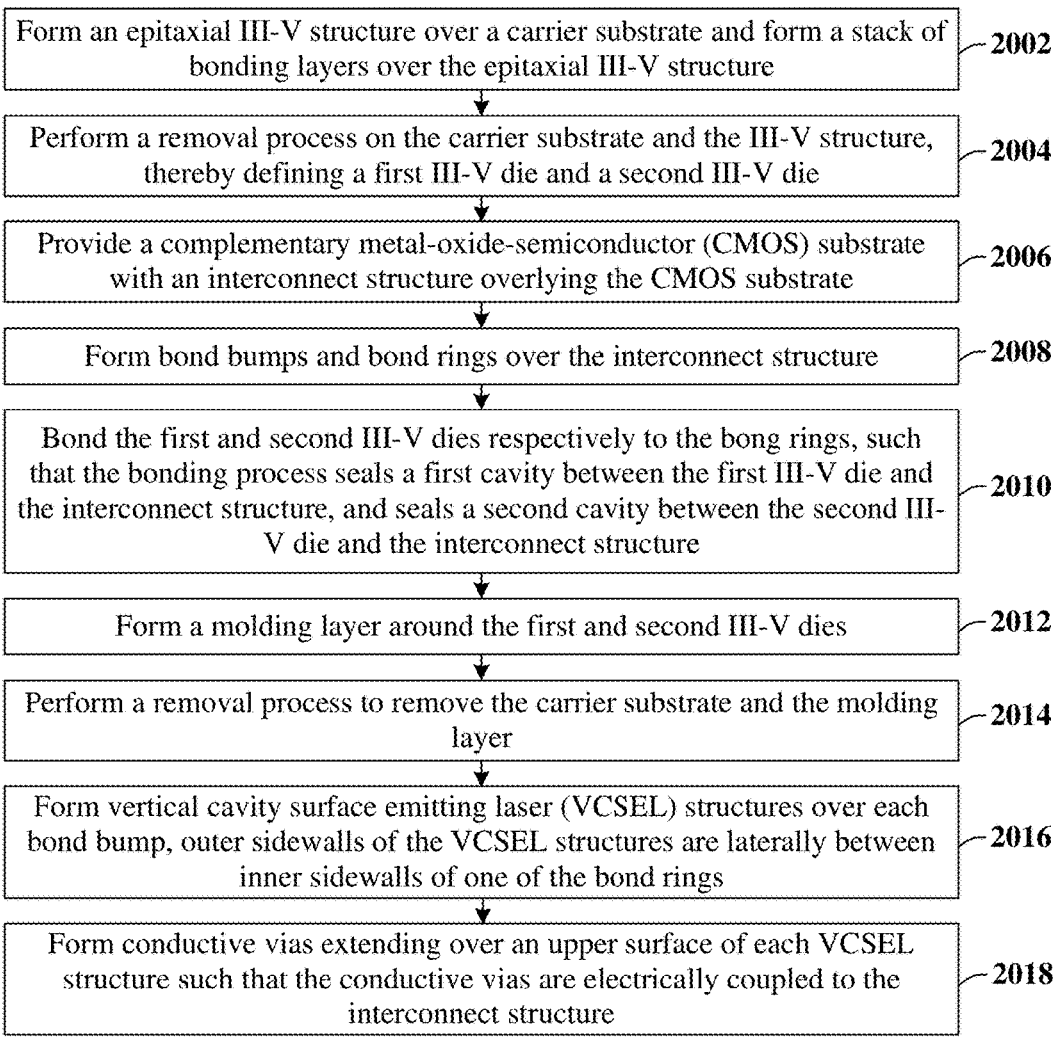
FIG. 20 illustrates a methodology in flowchart format that illustrates some embodiments of a method of forming a 3DIC comprising a CMOS IC and an III-V device structure.

FIG. 20 illustrates a method 2000 of forming a three-dimensional integrated chip (3DIC) comprising a complementary metal-oxide-semiconductor (CMOS) IC and III-V device structure. Although the method 2000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2002, an epitaxial III-V structure is formed over a carrier substrate and a stack of bonding layers is formed over the epitaxial III-V structure. FIG. 7 illustrates a cross-sectional view 700 corresponding to some embodiments of act 2002.

At act 2004, a removal process is performed on the carrier substrate and the III-V structure, thereby defining a first III-V die and a second III-V die. FIG. 8 illustrates a cross-sectional view 800 corresponding to some embodiments of act 2004.

At act 2006, a complementary metal-oxide-semiconductor (CMOS) substrate is provided, with an interconnect structure overlying the CMOS substrate. FIG. 9 illustrates a cross-sectional view 900 corresponding to some embodiments of act 2006.

At act 2008, bond bumps and bond rings are formed over the interconnect structure. FIG. 10A illustrates a cross-sectional view 1000A corresponding to some embodiments of act 2008.

At act 2010, the first and second III-V dies are respectively bonded to the bond rings. The bonding process seals a first cavity between the first III-V die and the interconnect structure, and seals a second cavity between the second III-V die and the interconnect structure. FIG. 11 illustrates a cross-sectional view 1100 corresponding to some embodiments of act 2010.

At act 2012, a molding layer is formed around the first and second III-V dies. FIG. 12 illustrates a cross-sectional view 1200 corresponding to some embodiments of act 2012.

At act 2014, a removal process is performed to remove the carrier substrate and the molding layer. FIG. 13 illustrates a cross-sectional view 1300 corresponding to some embodiments of act 2014.

At act 2016, vertical cavity surface emitting laser (VCSEL) structures are formed over each bond bump, such that outer sidewalls of the VCSEL structures are laterally between inner sidewalls of one of the bond rings. FIGS. 14, 15, and 16 illustrate cross-sectional views 1400, 1500, and 1600 corresponding to some embodiments of act 2016.

At act 2018, conductive vias are formed over an upper surface of each VCSEL structure, such that the conductive vias are electrically coupled to the interconnect structure. FIGS. 18 and 19 illustrate cross-sectional views 1800 and 1900 corresponding to some embodiments of act 2018.

Accordingly, in some embodiments, the present disclosure relates to a plurality of VCSEL structures respectively overlying a bond bump such that the bond bumps are completely surrounded by a bond ring.

In some embodiments, the present application provides a vertical cavity surface emitting laser (VCSEL) device, including a bond bump overlying a substrate; a VCSEL structure overlying the bond bump, the VCSEL structure includes a second reflector overlying an optically active region and a first reflector underlying the optically active region; and a bond ring overlying the substrate and laterally separated from the bond bump, wherein the bond ring continuously extends around the bond bump.

In some embodiments, the present application provides a semiconductor chip including a plurality of semiconductor devices disposed over a substrate; an interconnect structure disposed over and electrically coupled to the semiconductor device; a plurality of bond bumps overlying the metal stack structure; a plurality of vertical cavity surface emitting laser (VCSEL) structures, wherein the VCSEL structures respectively overlie the bond bumps; a stack of bonding layers disposed between the VCSEL structures and the bond bumps; and a bond ring surrounding the plurality of bond bumps, wherein the VCSEL structures and the bond bumps are laterally separated from the bond ring by a non-zero distance.

In some embodiments, the present application provides a method for forming a vertical cavity surface emitting laser (VCSEL) device, the method includes providing a complementary metal-oxide-semiconductor (CMOS) substrate having an interconnect structure overlying the CMOS substrate; forming bond bumps and bond rings over the interconnect structure; bonding first and second III-V dies respectively to the bond rings, the bonding process seals a first cavity between the first III-V die and the interconnect structure, and seals a second cavity between the second III-V die and the interconnect structure; forming a molding layer around the first and second III-V dies, wherein the bond rings block the molding layer from being formed below the first and second III-V dies; removing the molding layer; and forming VCSEL structures over each bond bump, wherein outer sidewalls of the VCSEL structures are laterally between inner sidewalls of one of the bond rings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a vertical cavity surface emitting laser (VCSEL) device, the method comprising:
   forming a bond bump and a bond ring over a substrate;
   bonding a semiconductor die to the bond ring;
   forming a molding layer around the semiconductor die, wherein the molding layer is laterally offset from a cavity between the semiconductor die and the substrate; and
   removing the molding layer; and
   forming a VCSEL structure over the bond bump, wherein the molding layer is removed before forming the VCSEL structure.

2. The method of claim 1, wherein the semiconductor die is a III-V die.

3. The method of claim 1, wherein bonding the semiconductor die to the bond ring seals the cavity between the semiconductor die and the substrate.

4. The method of claim 1, wherein the bond ring blocks the molding layer from being formed within the cavity.

5. The method of claim 1, further comprising:
   forming a III-V structure on a first face of a carrier substrate;
   forming a stack of bonding layers over the III-V structure; and
   etching the carrier substrate and the III-V structure to define the semiconductor die.

6. The method of claim 1, wherein while bonding the semiconductor die to the bond ring, outer sidewalls of the semiconductor die are aligned with outer sidewalls of the bond ring.

7. The method of claim 1, further comprising:
   forming a bond seed layer between the substrate and the bond bump, wherein after bonding the semiconductor die to the bond ring, the bond ring continuously vertically extends from a top surface of the bond seed layer to a bottom surface of the semiconductor die.

8. A method for forming a vertical cavity surface emitting laser (VCSEL) device, the method comprising:
   forming a III-V die comprising a bonding layer disposed on a carrier substrate;
   forming a bond seed layer over a substrate;
   forming a bond bump and a bond ring over the bond seed layer;
   bonding the III-V die to the bond ring, thereby sealing a cavity between a top surface of the bond seed layer and a bottom surface of the bonding layer; and
   etching the III-V die to form a VCSEL structure over the bond bump, wherein the cavity is disposed below the VCSEL structure.

9. The method of claim 8, further comprising:
   etching the bonding layer to unseal the cavity and expose the top surface of the bond seed layer.

10. The method of claim 8, further comprising:
    forming a conductive via over the substrate, wherein the conductive via extends from below the bonding layer to a point above an upper surface of the VCSEL structure.

11. The method of claim 8, further comprising:
    forming a molding layer over the substrate and along outer sidewalls of the bond ring and outer sidewalls of the III-V die.

12. The method of claim 11, further comprising:
    forming a III-V structure between the bonding layer and the carrier substrate before bonding the III-V die to the bond ring; and
    removing the carrier substrate with the molding layer in place, thereby exposing an upper surface of the III-V structure.

13. The method of claim 12, further comprising:
    removing the molding layer from over the substrate.

14. The method of claim 11, wherein the molding layer is disposed outside of the cavity.

15. A vertical cavity surface emitting laser (VCSEL) device, comprising:
    a bond bump overlying a substrate;
    a VCSEL structure overlying the bond bump;
    a bond ring overlying the substrate and laterally enclosing the bond bump, wherein the VCSEL structure is disposed laterally between inner sidewalls of the bond ring, wherein a height of the bond ring is equal to a height of the bond bump; and
    a dielectric structure overlying the substrate, wherein the dielectric structure continuously extends along and contacts a top surface of the bond ring, wherein the dielectric structure directly contacts an outer sidewall of the bond ring and an inner sidewall of the bond ring.

16. The VCSEL device of claim 15, wherein a distance between the outer sidewall of the bond ring and the inner sidewall of the bond ring is less than a width of the bond bump.

17. The VCSEL device of claim 15, wherein when viewed from above the bond bump has a first shape and the bond ring has a second shape different from the first shape.

18. The VCSEL device of claim 15, further comprising:
    a seed layer disposed between the bond ring and the substrate, wherein the dielectric structure continuously extends from opposing sidewalls of the bond ring to opposing sidewalls of the seed layer.

19. The VCSEL device of claim 15, wherein the dielectric structure continuously extends laterally from the inner sidewall of the bond ring to an outer sidewall of the bond bump.

20. The VCSEL device of claim 15, wherein a middle region of the VCSEL structure is laterally aligned with a middle region of the bond bump.

* * * * *